US009355696B1

(12) United States Patent
Magee et al.

(10) Patent No.: US 9,355,696 B1
(45) Date of Patent: May 31, 2016

(54) CALIBRATION IN A CONTROL DEVICE RECEIVING FROM A SOURCE SYNCHRONOUS INTERFACE

(71) Applicant: Xilinx, Inc., San Jose, CA (US)

(72) Inventors: Terence J. Magee, San Francisco, CA (US); Xiaoqian Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/534,487

(22) Filed: Nov. 6, 2014

(51) Int. Cl.
G11C 7/10 (2006.01)
G11C 7/22 (2006.01)
H03K 5/14 (2014.01)
G11C 11/00 (2006.01)

(52) U.S. Cl.
CPC ........ G11C 7/222 (2013.01); H03K 5/14 (2013.01); G11C 11/005 (2013.01)

(58) Field of Classification Search
CPC ...... G11C 7/222; G11C 7/22; G11C 11/4076; G11C 7/1066; G11C 7/1072; G11C 8/18; G11C 29/023; G11C 7/1093; G11C 29/50012; G11C 2207/2254; G11C 29/56012; G06F 13/689; G06F 1/12; G06F 2217/62; H04L 7/0037; H04L 7/0025; H04L 7/0041; H04L 7/10; H04L 7/04; H03K 5/05; H03K 5/1504; H03K 5/14; H04B 1/7073; H04B 17/11; G01R 31/31726; H04N 5/04
USPC ............ 365/189.02, 193, 194, 230.02, 233.1, 365/233.11, 233.12
See application file for complete search history.

(56) References Cited

U.S. PATENT DOCUMENTS

| 5,291,187 | A | * | 3/1994 | Wood | ................ G09G 5/06 345/60 |
| 6,646,953 | B1 | | 11/2003 | Stark | |
| 6,777,980 | B2 | * | 8/2004 | Young | ................ H04J 3/047 326/337 |
| 7,795,935 | B2 | | 9/2010 | Schneider et al. | |
| 8,427,194 | B2 | * | 4/2013 | Deas | ................ H04L 9/003 326/8 |

(Continued)

FOREIGN PATENT DOCUMENTS

CN            104135256           11/2014

OTHER PUBLICATIONS

Ternullo, Luigi, "Implementing an All Digital PHY and Delay Locked Loop for High Speed DDR2-3 Memory Interfaces," *EDN Network*, Oct. 15, 2009, www.edn.com.

*Primary Examiner* — Son Dinh
*Assistant Examiner* — Uyen B Tran
(74) *Attorney, Agent, or Firm* — Robert M. Brush

(57) ABSTRACT

In an example, a control device includes a data path, a clock path, a multiplexing circuit, and a calibration unit. The data path comprises a data delay unit coupled to a data input of a sampling circuit. The clock path comprises a clock delay unit coupled to a clock input of the sampling circuit. The multiplexing circuit selectively couples a reference clock or a data bus to an input of the data delay unit, and selectively couples the reference clock or a source clock to an input of the clock delay unit. The calibration unit is coupled to a data output of the sampling circuit. The calibration unit is operable to adjust delay values of the data delay unit and the clock delay unit based on the data output of the sampling circuit to establish and maintain a relative delay between the data path and the clock path.

20 Claims, 6 Drawing Sheets

(56) References Cited

U.S. PATENT DOCUMENTS

| | | |
|---|---|---|
| 2005/0047192 A1 | 3/2005 | Matsui et al. |
| 2009/0072857 A1 | 3/2009 | Perisetty |
| 2010/0194469 A1 | 8/2010 | Amrutur et al. |
| 2013/0271196 A1* | 10/2013 | Cao ................ G01R 31/31725 327/199 |
| 2014/0070862 A1 | 3/2014 | Palmer et al. |

* cited by examiner

CALIBRATION IN A CONTROL DEVICE RECEIVING FROM A SOURCE SYNCHRONOUS INTERFACE

TECHNICAL FIELD

Examples of the present disclosure generally relate to electronic circuits, in particular, to calibration in a control device receiving from a source synchronous interface.

BACKGROUND

Synchronous dynamic random access memories (SDRAMs), such as double data rate (DDR) SDRAM memories, are popular due to their performance and density. In order to reduce the amount of real estate on the memory chips, much of the burden of controlling the devices has been off-loaded to a memory control device. These memory control devices can reside on microprocessor, application specific integrated circuits (ASIC), field programmable gate array (FPGA) devices or the like, or alternately can reside on devices dedicated solely to the purpose of controlling SDRAM memories. An SDRAM memory includes a source synchronous interface that provides a source clock in parallel to a data bus.

When receiving from a source synchronous interface, skew on the data bus and skew between the source clock and the data bus provides a challenge to robust data acquisition. Such skew can reduce the effective size of the data eye for sampling the data bus by the source clock. One technique to compensate for skew involves attempting to match delay of the data and clock paths during implementation of the control device. However, such a technique suffers from on-chip variation (OCV), which can cause variation in delay of the data and clock paths despite the design. Further, such a technique is limited to a particular voltage and temperature (VT) point. As the VT point varies during device operation, delay of the data and clock paths varies despite the design.

SUMMARY

Techniques for calibration in a control device receiving from a source synchronous interface are described. In an example, a control device for receiving from a source synchronous interface having a data bus and a source clock is provided. The control device includes a data path, a clock path, a multiplexing circuit, and a calibration unit. The data path comprises a data delay unit coupled to a data input of a sampling circuit. The clock path comprises a clock delay unit coupled to a clock input of the sampling circuit. The multiplexing circuit is operable to selectively couple a reference clock or the data bus to an input of the data delay unit, and selectively couple the reference clock or the source clock to an input of the clock delay unit. The calibration unit is coupled to a data output of the sampling circuit. The calibration unit is operable to adjust delay values of the data delay unit and the clock delay unit based on the data output of the sampling circuit to establish and maintain a relative delay between the data path and the clock path.

In another example, a system comprises a synchronous dynamic random access memory (SDRAM) system coupled to a memory control device. The SDRAM system includes a data bus and a source clock. The memory control device includes a sampling circuit, a data delay unit, a clock delay unit, a multiplexing circuit, and a calibration unit. The data delay unit is coupled to a data input of the sampling circuit. The clock delay unit is coupled to a clock input of the sampling circuit. The multiplexing circuit is operable to selectively couple a reference clock or the data bus to an input of the data delay unit, and selectively couple the reference clock or the source clock to an input of the clock delay unit. The calibration unit is coupled to a data output of the sampling circuit. The calibration unit is operable to adjust delay values of the data delay unit and the clock delay unit based on the data output of the sampling circuit to establish and maintain a relative delay between outputs of the data delay unit and the clock delay unit.

In another example, a method of receiving from a source synchronous interface having a data bus and a source clock includes: coupling a reference clock to a data path and a clock path, the data path including a data delay unit coupled to a data input of a sampling circuit, the clock path including a clock delay unit coupled to a clock input of the sampling circuit; controlling the data delay unit and the clock delay unit to establish a relative delay between the data path and the clock path; coupling the data bus to the data path and the source clock to the clock path; and controlling the data delay unit and the clock delay unit to maintain the relative delay between the data path and the clock path.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for calibration in a control device receiving from a source synchronous interface are described. In an example, a control device for a source synchronous interface removes delay skew between bits of a parallel data bus and its source synchronous clock to successfully acquire data. The control device preserves the de-skew effect as voltage, temperature, or both (VT) of the system varies. The control device removes the negative effects of on-chip process variation and mismatch along data and clock paths so that the data and clock paths to the sampling circuit are delay matched. The control device maintains the relative delay between clock and data as VT varies over time. These and further aspects of the present disclosure are discussed below.

Figure 1:
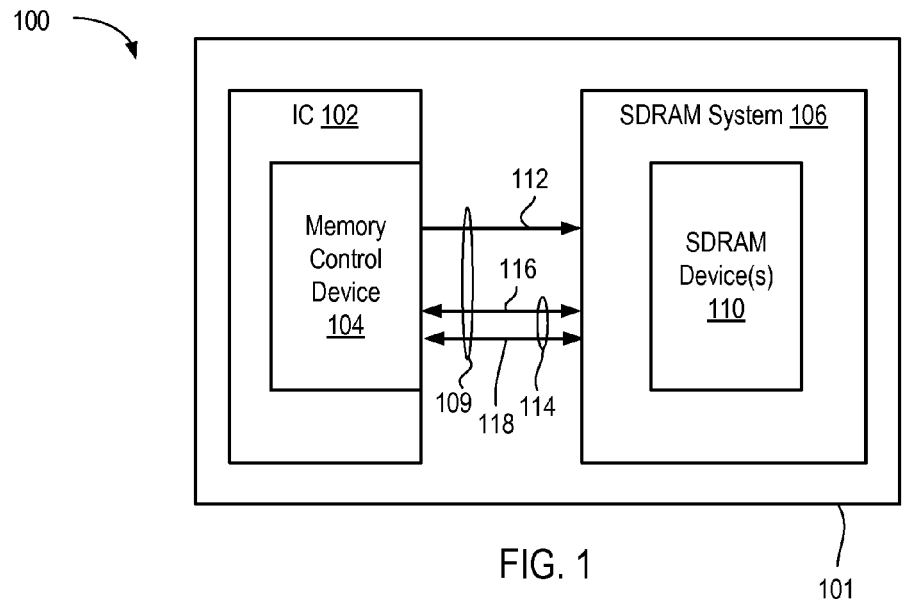
FIG. 1 is a block diagram showing an example of a system having an integrated circuit (IC) coupled to a synchronous dynamic random access memory (SDRAM) system.

FIG. 1 is a block diagram showing an example of a system 100 having an integrated circuit (IC) 102 coupled to a synchronous dynamic random access memory (SDRAM) system 106. The IC 102 and the SDRAM system 106 can be mounted on a printed circuit board (PCB) 101 or other type of substrate. The IC 102 includes a memory control device 104. The memory control device 104 is coupled to the SDRAM system 106 through a bus 109. The bus 109 is implemented using interconnect on the PCB 101. The bus 109 provides a control interface 112 and a source synchronous interface 114 between the memory control device 104 and the SDRAM system 106. The control interface 112 conveys control signals to the SDRAM system 106, such as address, command, and clock signals. The source synchronous interface 114 includes a data bus 116 and a source clock 118. For the SDRAM system 106, the data bus 116 conveys data (DQ) signals and the source clock 118 includes one or more data strobe (DQS) signals. The bus 109 can convey other signals, such as voltage supply signals. The IC 102 can be a device dedicated for the memory control device 104, or a device having other functionality, such as a microprocessor, application specific integrated circuit (ASIC), field programmable gate array (FPGA), system-on-chip (SoC), or the like.

The SDRAM system 106 includes one or more SDRAM devices 110. The SDRAM devices 110 can provide one or more ranks of memory on one or more modules attached to the PCB 101, such as one or more dual inline memory modules (DIMMs). Alternatively, the SDRAM devices 110 can be mounted to the PCB 101 without any specific modular structure. Example SDRAM devices 110 include DDR SDRAM devices (e.g., DDR2, DDR3, or DDR4 devices). The SDRAM system 106 can include other circuits to support operation of the SDRAM devices 110, such as registers, controllers, and the like (not shown).

For example, each of the SDRAM devices 110 can include a source synchronous interface having eight DQ signals and at least one DQS signal (e.g., a DQS signal and a negated DQS signal). A rank in the SDRAM system 106 can include nine SDRAM devices 110 to provide a source synchronous interface having a total of 72 DQ signals and at least 9 DQS signals. The SDRAM devices 110 can have source synchronous interfaces with other numbers of DQ and DQS signals, the ranks can have a different number of SDRAM devices, the source synchronous interface 114 can have other widths. For example, some SDRAM systems provide a data bus having a width of 144 DQ signals.

Figure 2:
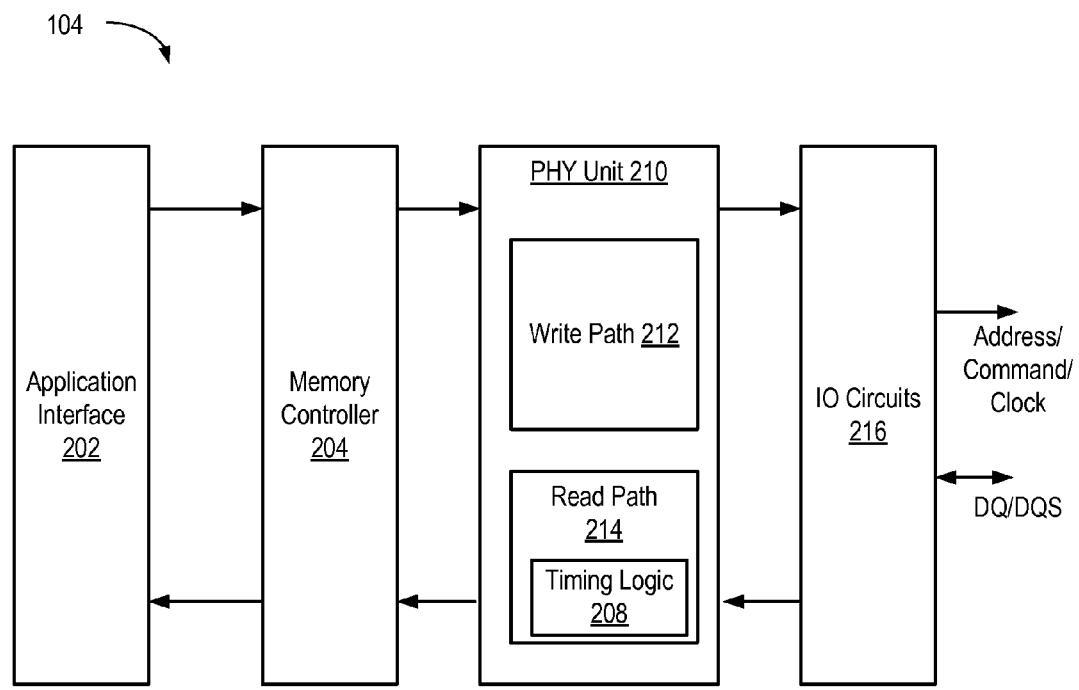
FIG. 2 is a block diagram showing an example of a memory control device.

FIG. 2 is a block diagram showing an example of the memory control device 104. The memory control device 104 includes an application interface 202, a memory controller 204, a physical (PHY) unit 210, and input/output (IO) circuits 216. The application interface 202 receives data to be written to the SDRAM system 106 ("write data") from another circuit (not shown), and provides data read from the SDRAM system 106 ("read data") to another circuit (not shown). The application interface 202 provides the write data to the memory controller 204. The memory controller 204 generates transactions to and from the SDRAM system 106. The memory controller 204 generates write transactions to store the write data in the SDRAM system 106, and generates read transactions to obtain the read data from the SDRAM system 106.

The IO circuits 216 include circuits for driving signals on the bus 109, receiving signals from the bus 109, shaping signals, and the like. The PHY unit 210 provides an interface between the memory controller 204 and the IO circuits 216. The PHY unit 210 outputs address, command, and clock signals for transmission by the IO circuits 216 over the control interface 112. The PHY unit 210 outputs DQ and DQS signals for transmission by the IO circuits 216 over the source synchronous interface 114 for writing data to the SDRAM system 106. The PHY unit 210 receives as input DQ and DQS signals received by the IO circuits 216 over the source synchronous interface 114 for reading data from the SDRAM system 106.

The PHY unit 210 includes write path logic 212 and read path logic 214. The write path logic 212 formats write transactions from the memory controller 204 for transmission of commands and write data to the SDRAM system 106. The read path logic 214 formats read transactions from the memory controller 204 for transmission of commands to, and reception of data from, the SDRAM system 106. The read path logic 214 includes timing logic 208 to control capture of read data from the source synchronous interface 114. The timing logic 208 compensates for skew on the data bus 116 and skew between the data bus 116 and source clock 118 when receiving read data from the source synchronous interface 114 of the SDRAM system 106.

Figure 3:
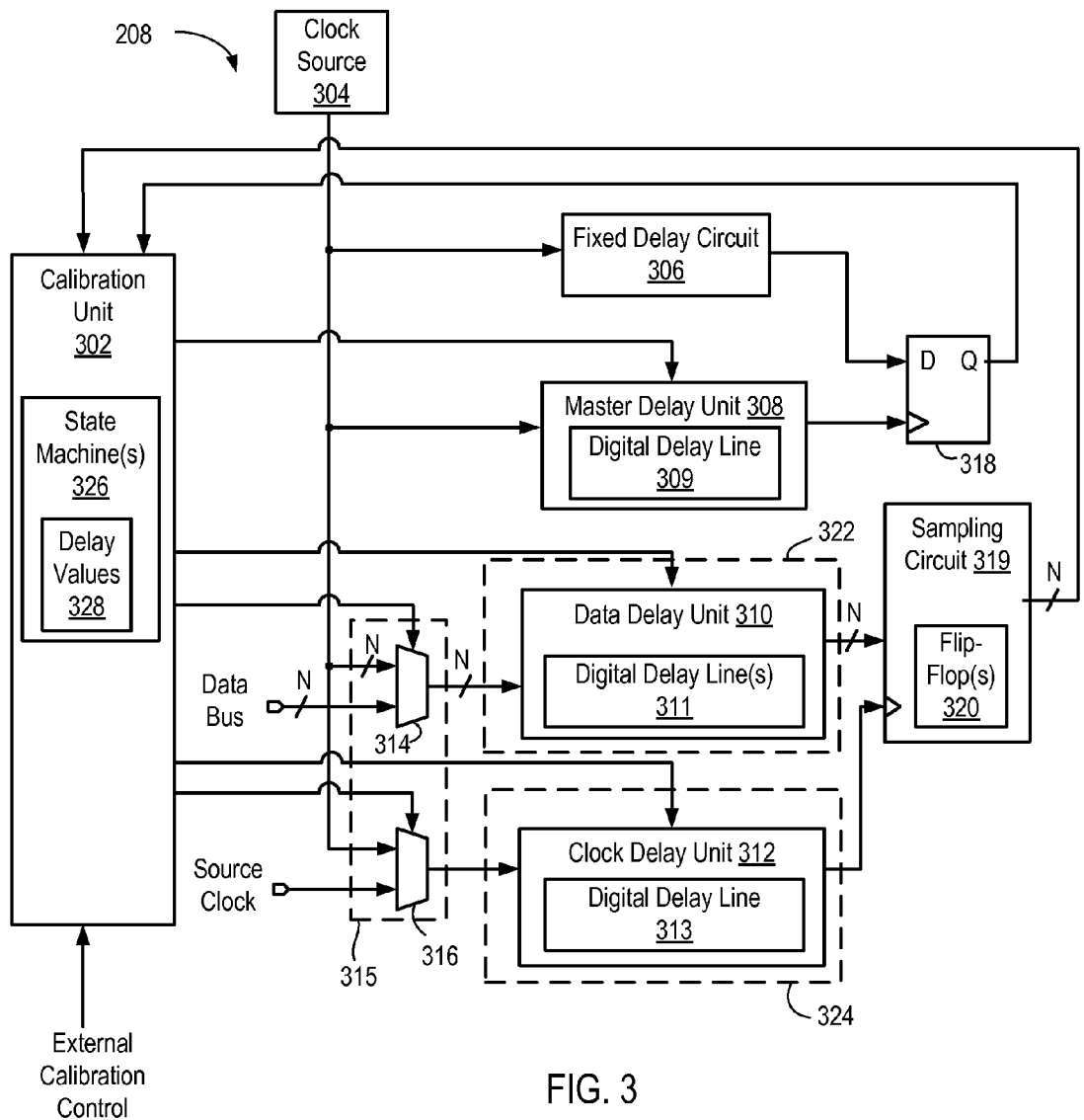
FIG. 3 is a block diagram showing an example of timing logic used to receive from a source synchronous interface of a source synchronous device.

FIG. 3 is a block diagram showing an example of the timing logic 208. While the timing logic 208 is discussed with respect to a source synchronous interface of the SDRAM system 106, it will be apparent from the description below that the timing logic 208 can be used to receive from source synchronous interfaces of any type of source synchronous device or system. In an example, the timing logic 208 includes a data path 322, a clock path 324, a multiplexing circuit 315, and a calibration unit 302. The data path 322 includes a data delay unit 310 coupled to a data input of a sampling circuit 319. The clock path 324 includes a clock delay unit 312 coupled to a clock input of the sampling circuit 319. The data path 322 is N bits wide, where N is an integer greater than zero and corresponds to the width of the data bus 116. The data delay unit 310 can include N digital delay lines (digital delay line(s) 311), one for each signal on the data path 322. The clock delay unit 312 can include a digital delay line 313 for a signal on the clock path 324. The data path 322 also includes conductors (schematically shown by arrows) for routing signals between the multiplexing circuit 315 and the data delay unit 310, and between the data delay unit 310 and the sampling circuit 319. The clock path 324 also includes conductors (schematically shown by arrows) for routing a signal between the multiplexing circuit 315 and the clock delay unit 312, and between the clock delay unit 312 and the sampling circuit 319.

A data output of the sampling circuit 319 is coupled to the calibration unit 302. The data output of the sampling circuit 319 is N-bits wide corresponding to the width of the data path 322. The sampling circuit 319 can include N flip-flops (flip-flop(s) 320), one for each signal on the data path 322. The output of the clock delay unit 312 is coupled to the clock input of each of the flip-flop(s) 320.

The multiplexing circuit 315 includes a multiplexer 314 and a multiplexer 316. The multiplexer 314 includes inputs coupled to the data bus 116 of the source synchronous interface 114 and a reference clock generated by a clock source 304. The inputs of the multiplexer 314 are N-bits wide, where one input receives N signals of the data bus 116 and the other input is tied to the reference clock. The calibration unit 302 is coupled to a control input of the multiplexer 314 to select either the data bus 116 or the reference clock to be coupled to the data path 322. The multiplexer 316 includes inputs coupled to the source clock 118 of the source synchronous interface 114 and the reference clock. The calibration unit 302 is coupled to a control input of the multiplexer 316 to select either the source clock 118 or the reference clock to be coupled to the clock path 324. The multiplexing circuit 315 can receive signals from the data bus 116 and the source clock 118 through the IO circuits 216.

In an example, the timing logic 208 also includes a master delay unit 308 coupled to a clock port of a flip-flop 318. The master delay unit 308 can include a digital delay line 309. The master delay unit 308 includes an input coupled to receive the reference clock. A data input of the flip-flop 318 is coupled to receive the reference clock. In an example, the data input of the flip-flop 318 can be coupled to an output of a fixed delay circuit 306 that applies a fixed delay to the reference clock. A data output of the flip-flop 318 is coupled to the calibration unit 302.

The calibration unit 302 is coupled to control inputs of the master delay unit 308, the data delay unit 310, and the clock delay unit 312. The calibration unit 302 sets delay values of the master delay unit 308, the data delay unit 310, and the clock delay unit 312 based on the data outputs of the sampling circuit 319 and the flip-flop 318. For example, the calibration unit 302 can set tap values of the digital delay line 309, the digital delay line(s) 311, and the digital delay line 313. The calibration unit 302 can include one or more state machines (state machine(s) 326) that output delay values 328 in response to the data outputs of the flip-flop 318 and the sampling circuit 319.

In operation, the calibration unit 302 controls the timing logic 208 to calibrate out the effect of changes in voltage, temperature, or both (referred to as changes to VT), as well as on-chip variation (OCV), by dynamically de-skewing the data path 322 and the clock path 324 prior to commencement of data transactions (e.g., read transactions for the SDRAM system 106). The delay applied to signal(s) on the data path 322 is the sum of the delay applied by the data delay unit 310 and an intrinsic delay of the data path 322. Likewise, the delay applied to a signal on the clock path 324 is the sum of the delay applied by the clock delay unit 312 and an intrinsic delay of the clock path 324. The intrinsic delays of the data path 322 and the clock path 324 cause an internal (e.g., on-chip) skew. Delays applied to the data bus 116 and the source clock 118 on the PCB 101 is referred to as external skew (e.g., skew caused by elements external to the IC 102).

The intrinsic delays of the data path 322 and the clock path 324 vary with changes in VT within the memory control device 104, and hence the internal skew varies with such changes in VT. In contrast, changes in VT within the memory control device 104 do not have a substantial effect on the external environment, and hence the external skew is constant or substantially constant over changes in VT within the memory control device 104. If the data path 322 and the clock path 324 are not delay matched, then the relative delay between the data bus and the source clock can vary over time (e.g., as VT changes). The timing logic 208 does not compensate for skew by attempting to lock in particular absolute delay values of the data delay unit 310 and the clock delay unit 312. Locking in particular absolute delay values for the data delay unit 310 and the clock delay unit 312 is only effective for the particular VT point at which they were established and will not compensate for internal skew as the VT point changes. Instead of locking in the absolute delay values, the timing logic 208 compensates for skew by establishing a relative delay between the data path 322 and the clock path 324 and operating to maintain the relative delay during data transactions.

The calibration unit 302 generally performs three calibration steps: (1) aligning signals on the data path 322 and the clock path 324 to maximize the data eye and compensate for internal skew; (2) centering the source clock in the data eye; and (3) updating delay values of the data delay unit 310 and the clock delay unit 312 during data transactions to perform automated VT tracking. The calibration unit 302 can control the multiplexing circuit 315 to operate in two modes: (1) a self-calibration mode, where the multiplexing circuit 315 couples the reference clock to the data path 322 and the clock path 324; and (2) a transaction mode, where the multiplexing circuit 315 couples the data bus 116 to the data path 322 and the source clock 118 to the clock path 324. The calibration process is first described assuming that external skew is minimized (e.g., through PCB trace matching of the bus 109).

In a first calibration step (alignment), the calibration unit 302 invokes the self-calibration mode. The calibration unit 302 adjusts the delay values of the data delay unit 310 and the clock delay unit 312 to align signals on the data bus 116 and the source clock 118. If the data bus 116 includes a plurality of data signals (e.g., N>1), then the calibration unit 302 adjusts the delay values of the data delay unit 310 to align the individual data signals on the data bus 116. The delay value required to align a particular signal with another signal is referred to as an "alignment delay value." In addition, the calibration unit 302 adjusts the delay value of the master delay unit 308 to align the output of the master delay unit 308 and the reference clock signal (e.g., as output by the fixed delay circuit 306. The calibration unit 302 then adjusts the delay value of the master delay unit 308 to establish a relative delay between the reference clock signal and the output of the master delay unit 308 (referred to as the "master relative delay"). For example, the calibration unit 302 can shift the output of the master delay unit 308 by T/2, where T is the period of the reference clock.

Figure 4A:
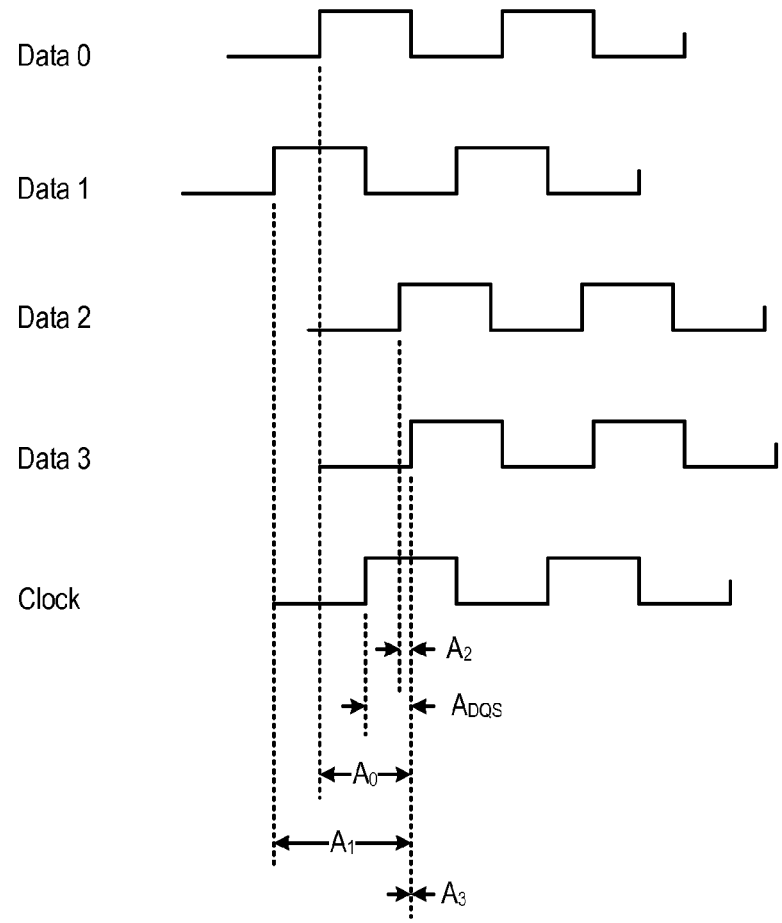
FIGS. 4A and 4B are signal plots showing examples of signals coupled to data and clock paths in a control device coupled to receive from a source synchronous interface.

FIG. 4A is a signal plot showing examples of signals coupled to the data path 322 and the clock path 324 in the self-calibration mode. In the present example, the data bus 116 includes four data signals and hence there are four signal paths in the data path 322 referred to as Data 0 through Data 3. The clock path 324 includes a single signal path referred to as Clock. Before alignment, the signals on the data path 322 are delayed with respect to one another. The calibration unit 302 can select one of the signals as a reference and adjust delay values of the data delay unit 310 to determine alignment delay values for the other signals. In general, the signal with the latest edge can be selected as the reference, which can be a data signal on the data path 322 or a clock signal on the clock path 324. In the present example, the signal on Data 3 is selected as the reference and an associated alignment delay value, $A_3$ is zero. The signals on Data 0 through Data 2 are delayed with respect to the reference signal on Data 3 and have associated alignment delay values $A_0$, $A_1$, and $A_2$. The signal on Clock is delayed with respect to the signal on Data 3 and has an associated alignment delay value of $A_{DQS}$. The calibration unit 302 adjusts the delay values of the data delay unit 310 and the clock delay unit 312 to determine $A_0$, $A_1$, $A_2$, $A_3$, and $A_{DQS}$.

Figure 4B:
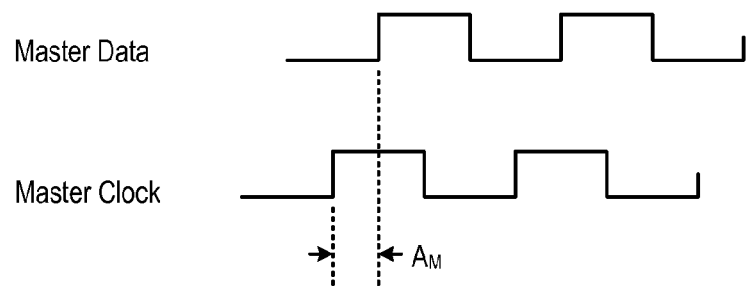

FIG. 4B is a signal plot showing examples of master data and clock signals in the self calibration mode. A signal, referred to as Master Data, is coupled to the data input of the flip-flop 318. A signal, referred to as Master Clock, is output by the master delay unit 308 and is coupled to the clock input of the flip-flop 318. The calibration unit 302 determines an alignment delay value, $A_M$, between Master Data and Master Clock. The fixed delay circuit 306 can be configured so that there is some initial non-zero delay between Master Data and Master Clock. As noted above, the calibration unit 302 then shifts output of the master delay unit 308 by a fixed amount to establish a master relative delay (e.g., shift by T/2).

Returning to FIG. 3, the calibration unit 302 can use the state machine(s) 326 to determine the alignment delay values $A_0, A_1, A_2, A_3, A_{DQS}$, and $A_M$ based on iteration(s) of adjusting the delay values and measuring the data outputs of the flip-flop 318 and the sampling circuit 319. In the second calibration step (clock centering), the calibration unit 302 can again invoke (or maintain) the self-calibration mode. The calibration unit 302 adjusts the delay value of the clock delay unit 312 to center the signal on the clock path 324 in the data eye. Since the clock path 324 has been aligned with the data path 322 in the first calibration step, clock centering is performed by adjusting the delay value of the clock delay unit 312 to shift the signal on the clock path 324 by 90 degrees (e.g., ¼ of a clock period T).

Figure 5:
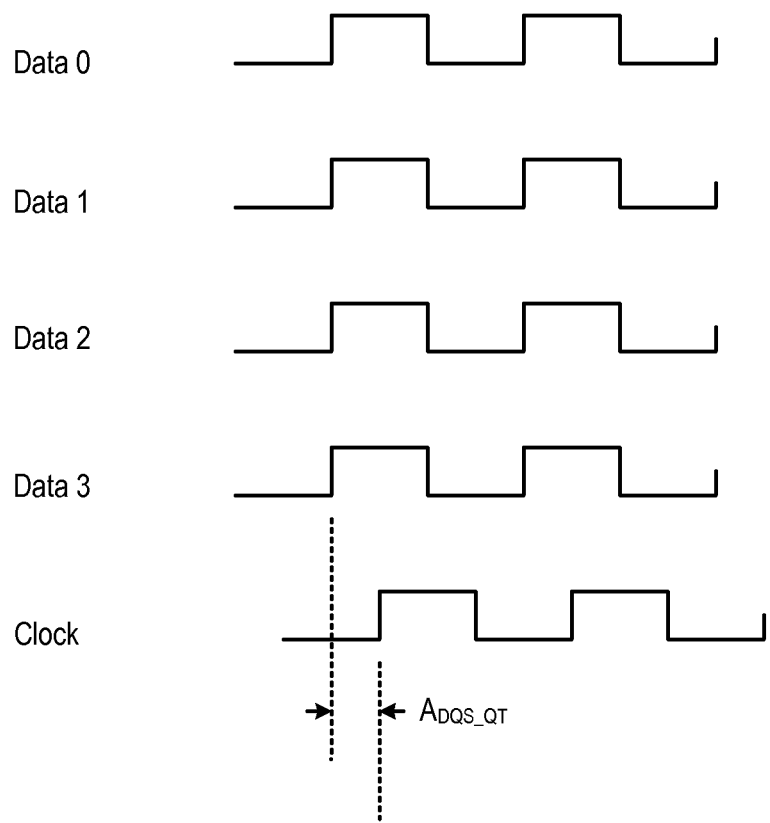
FIG. 5 is signal plot showing an example of signals on the data and clock paths in a control device coupled to receive from a source synchronous interface after alignment and clock centering.

FIG. 5 is signal plot showing an example of signals on the data path 322 and the clock path 324 after alignment and clock centering. The signals on Data 0, Data 1, Data 2, and Data 3 are aligned as discussed above. The signal on the clock path 324 is shifted by a shift delay $A_{DQS\_QT}$ to center the signal in the data eye (e.g., $A_{DQS\_QT}$=T/4, where T is the clock period). The delay value of the clock delay unit 312 is thus the sum of the alignment delay value $A_{DQS}$ and the shift delay $A_{DQS\_QT}$.

Returning to FIG. 3, after the second calibration step (clock centering), the calibration unit 302 has established a relative delay between the data path 322 and the clock path 324. The relative delay compensates for internal skew at a particular VT point. After self-calibration, the calibration unit 302 can invoke the transaction mode and the source clock will be centered in the data eye during read transactions. In a third calibration step (VT tracking), the calibration unit 302 operates to maintain the relative delay between the data path 322 and the clock path 324 by adjusting the delay values of the data delay unit 310 and the clock delay unit 312. During VT tracking, the calibration unit 302 adjusts the delay value of the master delay unit 308 to maintain the master relative delay established during delay alignment as VT changes. The calibration unit 302 maintains a ratio between the delay value of the master delay unit 308 and the delay values of the data delay unit 310 and the clock delay unit 312 (referred to as "gear ratios"). The calibration unit 302 changes the absolute delay values of the data delay unit 310 and the clock delay unit 312 to maintain the gear ratios, which will result in maintaining the relative delay between the data path 322 and the clock path 324 and keeping the source clock centered in the data eye across changes in VT.

When external skew is minimized, the alignment and clock centering steps of the calibration process can be performed using the self-calibration mode. No external calibration process is required (e.g., no external training process involving calibration transactions with the SDRAM system 106 is required). If external skew is not minimized, the alignment performed in the alignment step of the calibration process will not result in alignment of the data bus 116 and the source clock 118 as a result of external skew. As such, clock centering in the self-calibration mode will not result in centering the source clock 118 in the data eye. Accordingly, in some examples, the calibration unit 302 can perform external calibration after self-calibration alignment. The calibration unit 302 can invoke external calibration in response to an external calibration control signal from the PHY unit 210. For external calibration, the calibration unit 302 invokes the transaction mode to couple the data bus 116 to the data path 322 and the source clock 118 to the clock path 324. The PHY unit 210 initiates one or more calibration transactions with the SDRAM system 106, and the calibration unit 302 adjusts delay values of the data delay unit 310 and the clock delay unit 312 to center the source clock in the data eye. The new delay values account for both external skew and internal skew at a particular VT point. The calibration unit 302 can then perform VT tracking during read transactions to adjust the delay values and maintain the gear ratios, as discussed above, in order to compensate for corresponding changes in internal skew. As discussed above, the external skew is constant or substantially constant across VT changes within the memory control device 104.

Figure 6:
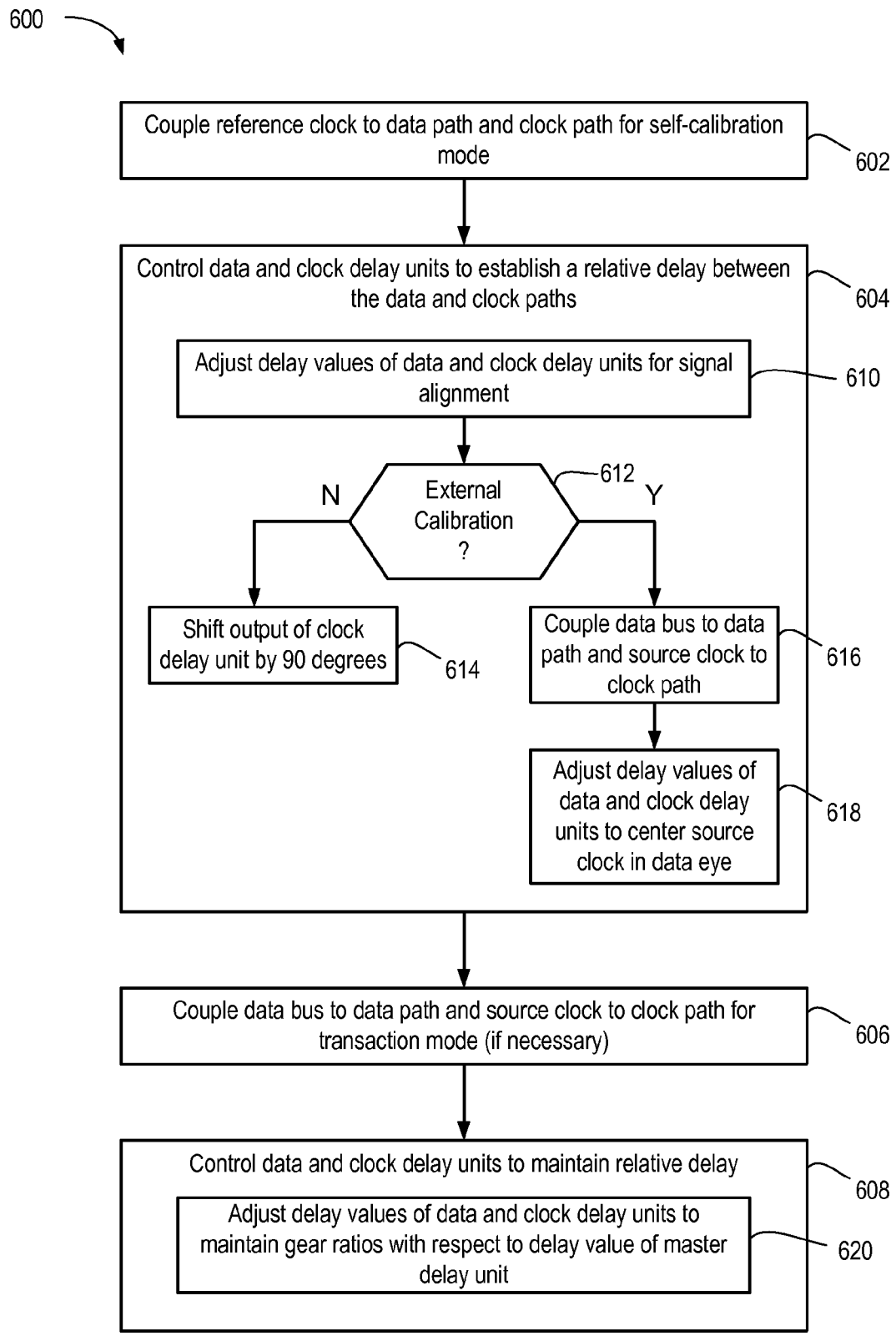
FIG. 6 is a flow diagram showing an example of a method of receiving from a source synchronous interface having a data bus and a source clock.

FIG. 6 is a flow diagram showing an example of a method 600 of receiving from a source synchronous interface having a data bus and a source clock. The method 600 begins at step 602, where the calibration unit 302 operates to couple the reference clock to the data and clock paths for a self-calibration mode. At step 604, the calibration unit 302 controls the data and clock delay units 310, 312 to establish a relative delay between the data and clock paths 322, 324. In an example, the step 604 begins at step 610, where the calibration unit 302 adjusts delay values of the data and clock delay units 310, 312 for signal alignment. At step 612, the calibration unit 302 determines if external calibration is to be performed. For example, the calibration unit 302 can receive an instruction to perform external calibration from the PHY unit 210. If external calibration is not to be performed, the step 604 proceeds to step 614, where the calibration unit 302 shifts the output of the clock delay unit 312 by 90 degrees. If external calibration is performed, the step 604 proceeds to step 616, where the calibration unit 302 operates to couple the data bus to the data path 322 and the source clock to the clock path 324. At step 618, the calibration unit 302 adjusts delay values of the data and clock delay units 310, 312 to center the source clock in the data eye.

At step 606, the calibration unit 302 operates to couple the data bus to the data path 322 and the source clock to the clock path 324 for a transaction mode. In some examples, the step 606 can be omitted if data bus and source clock are already coupled to the data path 322 and the clock path 324, respectively. At step 608, the calibration unit 302 controls the data and clock delay units 310, 312 to maintain the relative delay. In an example, the step 608 includes a step 620, where the calibration unit 302 adjusts delay values of the data and clock delay units 310, 312 to maintain gear ratios with respect to the delay value of the master delay unit 308.

Figure 7:
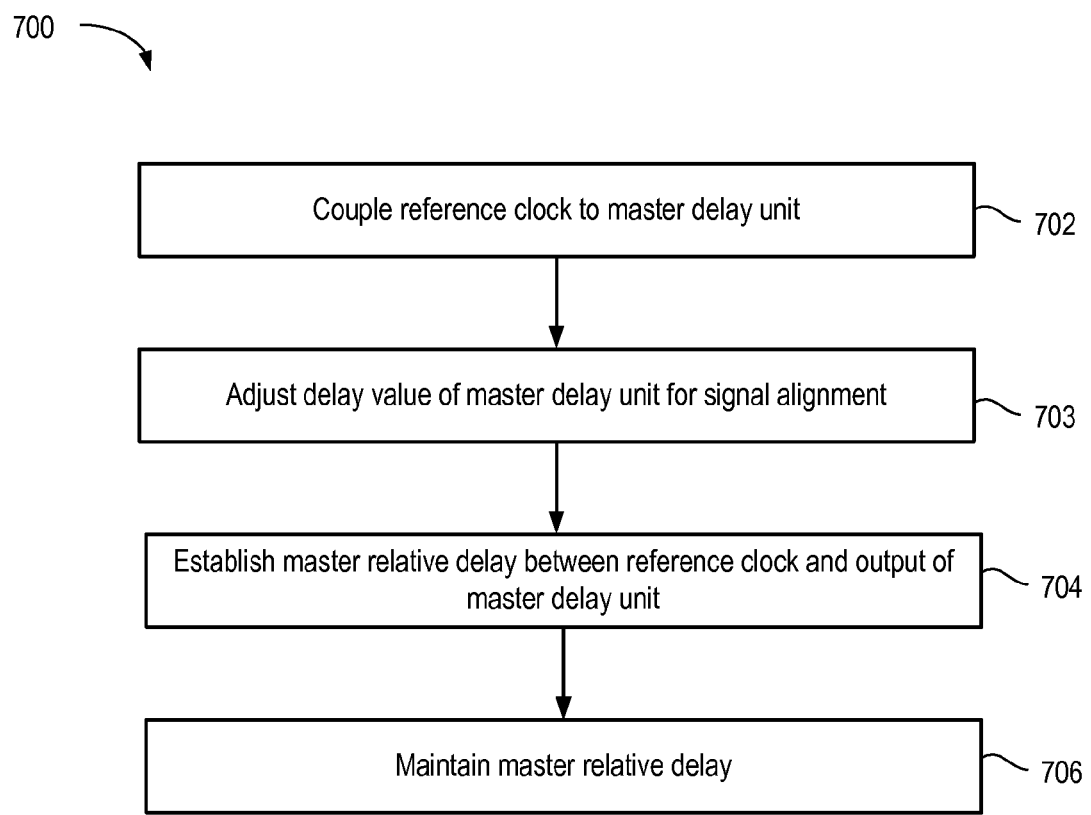
FIG. 7 is a flow diagram showing an example of a method of managing a master delay unit in a control device coupled to a receive from a source synchronous interface.

FIG. 7 is a flow diagram showing an example of a method 700 of managing the master delay unit 308. The method 700 begins at step 702, where the reference clock is coupled to the master delay unit 308. For example, as shown in FIG. 3, the input of the master delay unit 308 is coupled to the output of the clock source 304. At step 703, the calibration unit 302 adjusts the delay value of the mater delay unit for signal alignment. At step 704, the calibration unit 302 establishes a master relative delay between the reference clock and output of the master delay unit. The calibration unit 302 can perform step 704 during self-calibration. At step 706, the calibration unit 302 maintains the master relative delay. The calibration unit 302 can perform step 706 during transactions by adjusting the delay value of the master delay unit 308 to maintain the mater relative delay.

While the foregoing is directed to specific examples, other and further examples may be devised without departing from the basic scope thereof, and the scope thereof is determined by the claims that follow.

What is claimed is:

1. A control device for receiving from a source synchronous interface having a data bus and a source clock, the control device comprising:
   a data path comprising a data delay unit coupled to a data input of a sampling circuit;
   a clock path comprising a clock delay unit coupled to a clock input of the sampling circuit;
   a multiplexing circuit operable to selectively couple a reference clock or the data bus to an input of the data delay unit, and selectively couple the reference clock or the source clock to an input of the clock delay unit; and
   a calibration unit coupled to a data output of the sampling circuit, the calibration unit operable to adjust delay values of the data delay unit and the clock delay unit based on the data output of the sampling circuit to establish and maintain a relative delay between the data path and the clock path.

2. The control device of claim 1, wherein the calibration unit is operable to control the multiplexing circuit to couple the reference clock to the inputs of both of the data delay unit and the clock delay unit in a first mode, and couple the data bus to the input of the data delay unit and the source clock to the input of the clock delay unit in a second mode.

3. The control device of claim 2, wherein, while in the first mode, the calibration unit adjusts delay values of the data delay unit and the clock delay unit to align signals on the data path and the clock path and shift the output of the clock delay unit by 90 degrees.

4. The control device of claim 2, wherein, while in the first mode, the calibration unit adjusts delay values of the data delay unit and the clock delay unit to align signals on the data path and the clock path, and wherein, while in the second mode, the calibration unit adjusts the delay values of the data delay unit and the clock delay unit to center the source clock in a data eye of the data bus.

5. The control device of claim 2, wherein the data bus comprises a plurality of data signals, and wherein the data delay unit comprises a plurality of digital delay lines associated with the respective plurality of data signals.

6. The control device of claim 5, wherein, while in the first mode, the calibration unit adjusts tap values of the plurality of digital delay lines to align the plurality of data signals.

7. The control device of claim 1, further comprising:
   a master delay unit having an input coupled to receive the reference clock; and
   a flip-flop coupled to sample the reference clock according to output of the master delay unit;
   wherein the calibration unit is coupled to a data output of the flip-flop, and the calibration unit is operable to align the output of the master delay unit and the reference clock, establish a master relative delay between the output of the master delay unit and the reference clock, and adjust a delay value of the master delay unit to maintain the master relative delay.

8. The control device of claim 7, wherein the calibration unit is operable to maintain the relative delay between the data path and the clock path by adjusting delay values of the data delay unit and the clock delay unit to maintain ratios of the delay value of the master delay unit to the delay values of the data delay unit and the clock delay unit.

9. The control device of claim 7, further comprising:
   a fixed delay circuit having an input coupled to receive the reference clock and an output coupled to a data input of the flip-flop.

10. The control device of claim 1, wherein the source synchronous interface comprises a synchronous dynamic random access memory (SDRAM) interface, and wherein the control device is disposed in an integrated circuit (IC) coupled to an SDRAM system having the SDRAM interface.

11. A system, comprising:
   a synchronous dynamic random access memory (SDRAM) system having a data bus and a source clock; and
   a memory control device coupled to the SDRAM system, the memory control device including:
      a sampling circuit;
      a data delay unit coupled to a data input of the sampling circuit;
      a clock delay unit coupled to a clock input of the sampling circuit;
      a multiplexing circuit operable to selectively couple a reference clock or the data bus to an input of the data delay unit, and selectively couple the reference clock or the source clock to an input of the clock delay unit; and
      a calibration unit coupled to a data output of the sampling circuit, the calibration unit operable to adjust delay values of the data delay unit and the clock delay unit based on the data output of the sampling circuit to establish and maintain a relative delay between outputs of the data delay unit and the clock delay unit.

12. The system of claim 11, wherein the calibration unit is operable to control the multiplexing circuit to couple the reference clock to the inputs of both the data delay unit and the clock delay unit in a first mode and, while in the first mode, adjust delay values of the data delay unit and the clock delay unit to align outputs of the data delay unit and the clock delay unit and shift the output of the clock delay unit by 90 degrees.

13. The system of claim 12, wherein the calibration unit is operable to control the multiplexing circuit to couple the reference clock to the inputs of both the data delay unit and the clock delay unit in a first mode and, while in the first mode, adjust delay values of the data delay unit and the clock delay unit for signal alignment, and wherein the calibration unit is operable to control the multiplexing circuit to couple the data bus to the input of the data delay unit and the source clock to the input of the clock delay unit in a second mode and, while in the second mode, adjust the delay values of the data delay unit and the clock delay unit to center the source clock in a data eye of the data bus.

14. The system of claim 12, wherein the data bus comprises a plurality of data signals, wherein the data delay unit comprises a plurality of digital delay lines associated with the respective plurality of data signals, and wherein, while in the first mode, the calibration unit is operable to adjust tap values of the plurality of digital delay lines to align the plurality of data signals.

15. The system of claim 11, wherein the memory control device further comprises:
   a master delay unit having an input coupled to receive the reference clock; and
   a flip-flop coupled to sample the reference clock according to output of the master delay unit;
   wherein the calibration unit is coupled to a data output of the flip-flop, and the calibration unit is operable to:
      align the output of the master delay unit and the reference clock;

establish a master relative delay between the output of the master delay unit and the reference clock and adjust a delay value of the master delay unit to maintain the master relative delay; and maintain the relative delay between the data path and the clock path by adjusting delay values of the data delay unit and the clock delay unit to maintain ratios of the delay value of the master delay unit to the delay values of the data delay unit and the clock delay unit.

16. A method of receiving from a source synchronous interface having a data bus and a source clock, the method comprising:

coupling a reference clock to a data path and a clock path, the data path including a data delay unit coupled to a data input of a sampling circuit, the clock path including a clock delay unit coupled to a clock input of the sampling circuit;

controlling the data delay unit and the clock delay unit to establish a relative delay between the data path and the clock path;

coupling the data bus to the data path and the source clock to the clock path; and controlling the data delay unit and the clock delay unit to maintain the relative delay between the data path and the clock path.

17. The method of claim 16, wherein the controlling the data delay unit and the clock delay unit to establish the relative delay between the data path and the clock path comprises:

adjusting delay values of the data delay unit and the clock delay unit to:
align signals on the data path and the clock path; and
shift the output of the clock delay unit by 90 degrees.

18. The method of claim 16, wherein the controlling the data delay unit and the clock delay unit to establish the relative delay between the data path and the clock path comprises:

adjusting delay values of the data delay unit and the clock delay unit to align signals on the data path and the clock path;

coupling the data bus to the data path and the source clock to the clock path; and adjusting the delay values of the data delay unit and the clock delay unit to center the source clock in a data eye of the data bus.

19. The method of claim 16, further comprising:

coupling the reference clock to a master delay unit;

aligning the output of the master delay unit and the reference clock;

controlling the master delay unit to establish a master relative delay between output of the master delay unit and the reference clock; and adjusting a delay value of the master delay unit to maintain the master relative delay;

wherein the controlling the data delay unit and the clock delay unit to maintain the relative delay between the data path and the clock path comprises:

adjusting delay values of the data delay unit and the clock delay unit to maintain ratios of the delay value of the master delay unit to the delay values of the data delay unit and the clock delay unit.

20. The method of claim 16, wherein the source synchronous interface comprises a synchronous dynamic random access memory (SDRAM) interface, and wherein the data path and the clock path are disposed in an integrated circuit (IC) coupled to an SDRAM system having the SDRAM interface.

* * * * *